US011140472B2

(12) United States Patent
Chow et al.

(10) Patent No.: US 11,140,472 B2
(45) Date of Patent: Oct. 5, 2021

(54) SYSTEM AND METHOD FOR EXPERIENCING MUSIC VIA VIBRATIONS

(71) Applicants: Jeremy Chow, Boston, MA (US); Lucas Barton, Boston, MA (US)

(72) Inventors: Jeremy Chow, Boston, MA (US); Lucas Barton, Boston, MA (US)

(73) Assignees: Jeremy Chow, Boston, MA (US); Lucas Barton, Boston, MA (US)

( * ) Notice: Subject to any disclaimer, the term of this patent is extended or adjusted under 35 U.S.C. 154(b) by 0 days.

(21) Appl. No.: 16/846,732

(22) Filed: Apr. 13, 2020

(65) Prior Publication Data

US 2020/0329300 A1 Oct. 15, 2020

Related U.S. Application Data

(60) Provisional application No. 62/833,370, filed on Apr. 12, 2019.

(51) Int. Cl.
| *H04R 1/26* | (2006.01) |
| *G08B 6/00* | (2006.01) |
| *H04R 3/04* | (2006.01) |
| *H03F 3/181* | (2006.01) |
| *H03F 3/217* | (2006.01) |
| *H04R 1/02* | (2006.01) |

(52) U.S. Cl.
CPC .............. *H04R 1/26* (2013.01); *G08B 6/00* (2013.01); *H03F 3/181* (2013.01); *H04R 1/025* (2013.01); *H04R 3/04* (2013.01); *H03F 3/217* (2013.01); *H03F 2200/03* (2013.01); *H04R 2201/023* (2013.01); *H04R 2400/01* (2013.01); *H04R 2420/07* (2013.01); *H04R 2430/03* (2013.01)

(58) Field of Classification Search
CPC ....... G08B 6/00; H03F 2200/03; H03F 3/181; H03F 3/187; H03F 3/217; H03F 3/68; H04R 1/025; H04R 1/26; H04R 2201/023; H04R 2400/01; H04R 2420/07; H04R 2430/03; H04R 3/04
USPC ................................ 381/59, 111, 120, 333
See application file for complete search history.

(56) References Cited

U.S. PATENT DOCUMENTS

| 4,583,245 A * | 4/1986 | Gelow | H04R 3/14 381/100 |
| 7,151,524 B2 * | 12/2006 | Polgar | G06F 1/163 345/156 |
| 8,160,276 B2 * | 4/2012 | Liao | H04B 11/00 381/111 |

(Continued)

*Primary Examiner* — Vivian C Chin
*Assistant Examiner* — Friedrich Fahnert
(74) *Attorney, Agent, or Firm* — Goodwin Procter LLP

(57) ABSTRACT

A technique for enabling a person to experience music haptically includes splitting an audio signal representing music into an original low-frequency band and at least one high-frequency band, and translating each high-frequency band into a corresponding synthesized low-frequency band. The original low-frequency-band signal and each synthesized low-frequency-band signal is used to excite a respective exciter, which can produce vibrations corresponding to the received signal. By placing the exciters in contact with or proximate to the body of a person, the person can experience the music, including not only the low-frequency components of the music but also, at least to some extent, the high-frequency components.

20 Claims, 8 Drawing Sheets

(56) References Cited

U.S. PATENT DOCUMENTS

2014/0275730 A1\* 9/2014 Lievens ................. H04R 25/70
  600/25
2019/0122018 A1\* 4/2019 Kho ..................... G06K 9/0002

\* cited by examiner

SYSTEM AND METHOD FOR EXPERIENCING MUSIC VIA VIBRATIONS

CROSS-REFERENCE TO RELATED APPLICATIONS

This application claims priority to and benefit of U.S. Provisional Patent Application No. 62/833,370, entitled "Music Vest for the Deaf and Hard of Hearing," filed on Apr. 12, 2019, the entire contents of which are incorporated herein by reference.

FIELD OF THE INVENTION

This disclosure generally relates to processing and transformation of audio signals and, in particular, to controlling vibrations of exciters using audio signals.

BACKGROUND

People all over the world, of different ages, backgrounds, etc., enjoy different kinds of music. Some listen to music at home or the workplace, and/or in the car or on a train or bus, and/or also at public venues, such as in live concerts, dance clubs, etc. Those who have either partially or completely impaired hearing, however, are often denied the full enjoyment of music.

To enable the hearing impaired to experience music at least to some extent, techniques have been developed whether the audio signal carrying musical information is used to cause vibrations of a transducer that is placed close to or in contact with a person. The vibrations of the transducer generally correspond to the music, e.g., in terms of rhythm and/or intensity and, by experiencing the vibrations the person can experience music, not by hearing it, but haptically, i.e., by touch.

A common problem experienced by many such techniques is the limited response a person may have to the vibrations of a transducer. In particular, an audio signal representing music typically includes frequencies ranging from 20 Hz up to 5 kHz and, sometimes, even higher frequencies (e.g., up to 20 kHz) that may include overtones (multiples) of certain lower frequencies. Such a large set of frequencies can express many rich qualities of the music such as pitch, tone, and timbre. A transducer, when supplied with an audio signal, generally vibrates, at a particular instant, at a frequency that is dominant in the audio signal at that instant. When placed on or near (within a few mm) the skin of a person, the person can feel or perceive the vibrations of the transducer. Beyond a certain frequency, however, the perception of the vibrations of the transducer by the skin generally begins to decline. At and beyond some higher frequency, the perception may end completely, even when the transducer continues to vibrate at those high frequencies. As such, many known techniques filter out such high frequencies from the audio signal, and supply only a filtered audio signal to the transducers. The person wearing the transducer cannot, therefore, experience the musical information included in these filtered out higher frequencies.

SUMMARY

In various embodiments, techniques are described herein that allow a person, e.g., a person with a hearing impairment, to experience and enjoy music haptically, where the person can experience the musical information contained in at least some frequencies at or above a "perception cut-off frequency," i.e., any frequency in a range of frequencies starting from a frequency at which a typical person's perception of the vibrations of a transducer begins to decline, and up to a frequency at which a typical person's perception ends. The perception cut-off frequency can thus be 750 Hz, 1 kHz, 1.2 kHz, 1.25 kHz, 2 kHz, 2.5 kHz, etc. Allowing a person to haptically experience musical content at least some frequencies above the perception cut-off frequency is achieved, in part, by filtering such high frequencies but, rather than excluding them, a certain portion or band of the audio signal at these high frequencies is translated into a low-frequency band below the perception cut-off frequency. The translated band is then supplied to the transducer, so that the person can experience the original high frequencies at least to some extent.

Accordingly, in one aspect, a system is provided for delivering audio signals. The system includes a first filter that splits an input audio signal into an original low-frequency band and an original high-frequency band, and a first frequency shifter that transforms at least a portion of the original high-frequency band into a first synthesized low-frequency band. The system also includes a first first-location exciter (i.e., a first exciter located at a first location) that is configured to receive the original low-frequency band and produce corresponding vibrations, and a first second-location exciter (i.e., a first exciter located at a second location) that is configured to receive the first synthesized low-frequency band and produce corresponding vibrations.

The original low-frequency band may include audio frequencies that are less than or equal to an original low-frequency threshold, and the original high-frequency band may include audio frequencies that are greater than or equal to the original low-frequency threshold. The first synthesized low-frequency band may include audio frequencies less than or equal to a synthesized low-frequency threshold. The original low-frequency threshold or the synthesized low-frequency threshold may be adjustable. In some embodiments, the original low-frequency threshold is about 1 kHz, and/or the synthesized low-frequency threshold is about 1 kHz. The system may include a wearable vest, where the first first-location exciter is affixed to a front of the wearable vest, and the first second-location exciter is affixed to a back of the wearable vest.

In some embodiments, the system includes a second filter that splits the original high-frequency band into a first original high-frequency subband and a second original high-frequency subband. The first frequency shifter may transform the first original high-frequency subband into the first synthesized low-frequency band. The system may also include a second frequency shifter that transforms the second original high-frequency subband into a second synthesized low-frequency band, and a first third-location exciter configured to receive the second synthesized low-frequency band and produce corresponding vibrations.

The original low-frequency band may include audio frequencies less than or equal to an original low-frequency threshold, and the first original high-frequency subband may include audio frequencies greater than or equal to the original low-frequency threshold, but less than or equal to a first original high-frequency threshold. The second original high-frequency subband may include audio frequencies greater than or equal to the first original high-frequency threshold. Moreover, the first synthesized low-frequency band may include audio frequencies less than or equal to a first synthesized low-frequency threshold, and the second synthesized low-frequency band may include audio frequencies less than or equal to a second synthesized low-frequency threshold.

One or more of the original low-frequency threshold, the first original high-frequency threshold, the first synthesized low-frequency threshold, or the second synthesized low-frequency threshold may be adjustable. In some embodiments, the original low-frequency threshold is about 1 kHz, and/or the first original high-frequency threshold is about 2 kHz, and/or the first synthesized low-frequency threshold is about 1 kHz, and/or the second synthesized low-frequency threshold is about 1 kHz.

In some embodiments, the system includes a wearable vest, where the first first-location exciter is affixed to a front of the wearable vest. The first second-location exciter is affixed to an upper portion of a back of the wearable vest, and the first third-location exciter is affixed to a lower portion of the back of the wearable vest. The system may also include a second first-location exciter configured to receive the original low-frequency band and produce corresponding vibrations, where the second first-location exciter is affixed to the front of the wearable vest. In addition, the system may include a second second-location exciter configured to receive the first synthesized low-frequency band and produce corresponding vibrations, where the second second-location exciter is affixed to the upper portion of a back of the wearable vest; and a second third-location exciter configured to receive the second synthesized low-frequency band and produce corresponding vibrations, where the second third-location exciter is affixed to the lower portion of a back of the wearable vest.

In some embodiments, the system includes a first amplifier amplifying the original low-frequency band, and/or a second amplifier amplifying the first synthesized low-frequency band. The system may include a low-pass pre-filter that filters out frequencies above an adjustable permitted-frequency threshold from the input audio signal. The adjustable permitted-frequency threshold may be about 4 kHz. In some embodiments, the first first-location exciter and the first second-location exciters are adjustably affixed to a wearable pad.

In some embodiments, the system includes a second first-location exciter that is configured to receive the original low-frequency band and produce corresponding vibrations, and a second second-location exciter that is configured to receive the first synthesized low-frequency band and produce corresponding vibrations.

The system may include a power supply, a processor implementing the first filter and/or the first frequency shifter, and a vest or a harness. The vest or the harness may have a first exciter attachment at a first location, for holding the first first-location exciter; and a second exciter attachment at a second location, for holding the first second-location exciter. The vest or the harness may also include one or more component attachments for holding one or more of the power supply, the processor, or an amplifier. In some embodiments, the weight of the system is less than 3.5 lbs. The thickness of the first first-location exciter, and/or any other exciter, may be less than 1 inch. In some embodiments, the system includes an attachment for placing the first first-location exciter in contact with or near a person's skin. The attachment, which may be used with or without a vest or a harness, may include one or more of: a pocket (that may be sewn), a pad, a vibration attenuating pad, a vibration amplifying pad, a pad having an area larger than an area of the first first-location exciter, a pad having an adjustment mechanism to adjust pressure of the first first-location exciter on the person's skin, an elastic band, or an adhesive.

In some embodiments, the input audio signal is supplied to the first filter via a first wireless link. The first filter may be electrically coupled to the first frequency shifter via a second wireless link. The first filter may be electrically coupled to the first first-location exciter via a third wireless link, and/or the first frequency shifter may be electrically coupled to the first second-location exciter via a fourth wireless link.

In another aspect, a method is provided for operating exciters using an audio signal. The method includes splitting, using a first filter, an input audio signal into an original low-frequency band and an original high-frequency band, and transforming, using a first frequency shifter, at least a portion of the original high-frequency band into a first synthesized low-frequency band. The method also includes supplying the original low-frequency band to a first first-location exciter for producing corresponding vibrations, and supplying the first synthesized low-frequency band to a first second-location exciter for producing corresponding vibrations. In various embodiments, the method may be adapted to perform various operations that different embodiments of the system described above are configured to perform.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals/labels generally refer to the same or similar elements. In different drawings, the same or similar elements may be referenced using different reference numerals/labels, however. The drawings are not necessarily to scale, emphasis instead being placed upon illustrating aspects of the invention. In the drawings.

DETAILED DESCRIPTION

Figure 1A:
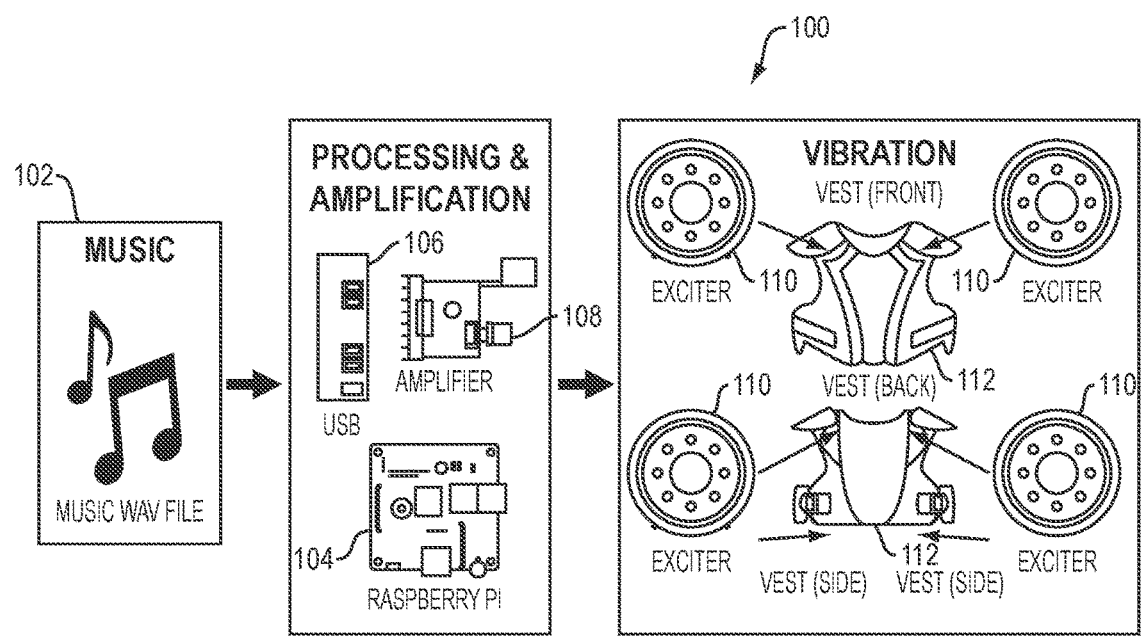
FIG. 1A schematically depicts a system for haptically experiencing music, according to one embodiment.

One goal of the techniques described herein is to enable a person, e.g., a person with a hearing impairment, to experience haptically, i.e., via touch, as much portion of the music as possible. As used herein, the term "hearing impairment" includes both partial impairment (partial deafness) and complete impairment or deafness. Therefore, with reference to FIG. 1A, in a system 100, an input music signal 102 is received at a processor 104. The processor 104 can be a microprocessor running certain signal processing software and filters, as described below; a microcontroller performing these operations by executing stored firmware; custom circuitry implemented on a printed circuit board; an application specific integrated circuit (ASIC); a field programmable gate array (FPGA) circuitry; or a combination of two or more of such components. The processor 104 may receive the audio signal via a universal serial bus (USB) interface 106. In some embodiments, the interface may be included in the processor. In some other embodiments, the processor 104 may receive the audio signal 102 wirelessly, e.g., via a BLUETHHOTH™ connection. The audio signal may be received as an MP3 signal, MIDI signal, WAV signal, or any other type of digital or analog signal. An input analog signal may be converted into a digital signal during the processing and translation thereof.

After processing the received audio signal (as described below), the processed signal is amplified by the amplifier 108, and the amplified signal is supplied to one or more exciters 110. Each exciter vibrates in response to its input signal. The use of the amplifier is optional and, as such, in some embodiments the output signal of the processor 104 may be supplied directly to one or more exciters 110. In some embodiments, the exciters 110 are affixed to a vest 112 that can be worn by a person, so that the person can experience music haptically. The system 100 provides one particular arrangement of the exciters 110 where exciters 110a, 110b are affixed to the inside of the front of the vest 112 and exciters 110c, 110d are affixed to the inside of the back of the vest 112.

It should be understood that the total number of exciters used need not be four and/or, their locations can be different from those in the system 100. At least two exciters are included in various embodiments, and different embodiments may use different numbers (e.g., 2, 3, 4, 6, 8, etc.) of exciters. The different exciters 110 are generally affixed to different parts of the vest 112, so that the vibrations produced by these exciters can be experienced by the person wearing the vest 112 at different parts of the torso. For example, different exciters can be affixed to the vest 112 such that one or more exciters is proximal to left/right sides of the torso; upper front portion of the torso; and/or back front, middle, and lower portions of the torso, etc. In some embodiments, each exciter is coupled to a respective amplifier (such as the amplifier 108). In other embodiments, one amplifier may supply a processed signal to two or more exciters. The coupling between an amplifier and an exciter 110 or between the processor 104 and an exciter 110 can be wired or wireless.

Figure 1B:
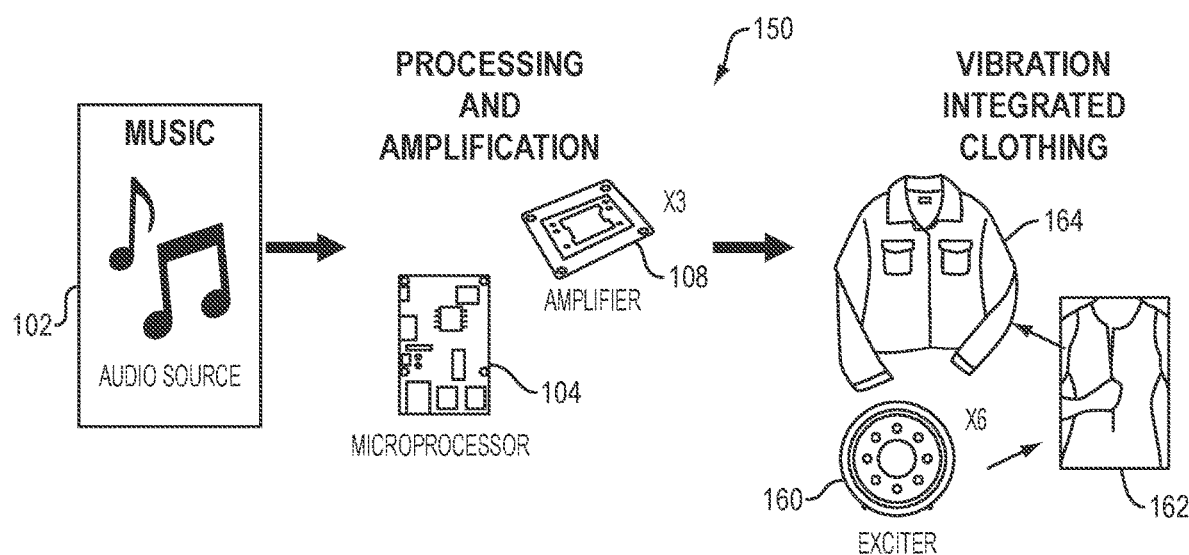
FIG. 1B schematically depicts a system for haptically experiencing music, according to another embodiment.

FIG. 1B depicts a system 150 that is similar to the system 100 shown in FIG. 1A. Instead of 4 exciters 110, the system 150 includes 6 exciters 160 that have a thin profile (as described below). The vest 162 is also a thinner vest compared to the vest 112 such that conventional clothing, such as a shirt 164 can be worn over the vest 162, concealing the exciters 160 and other components of the system 150. A system such as the system 150 can be worn in public, so that the user can experience and enjoy music outside of the home, such as in an office, at a dance club, etc.

Figure 2:
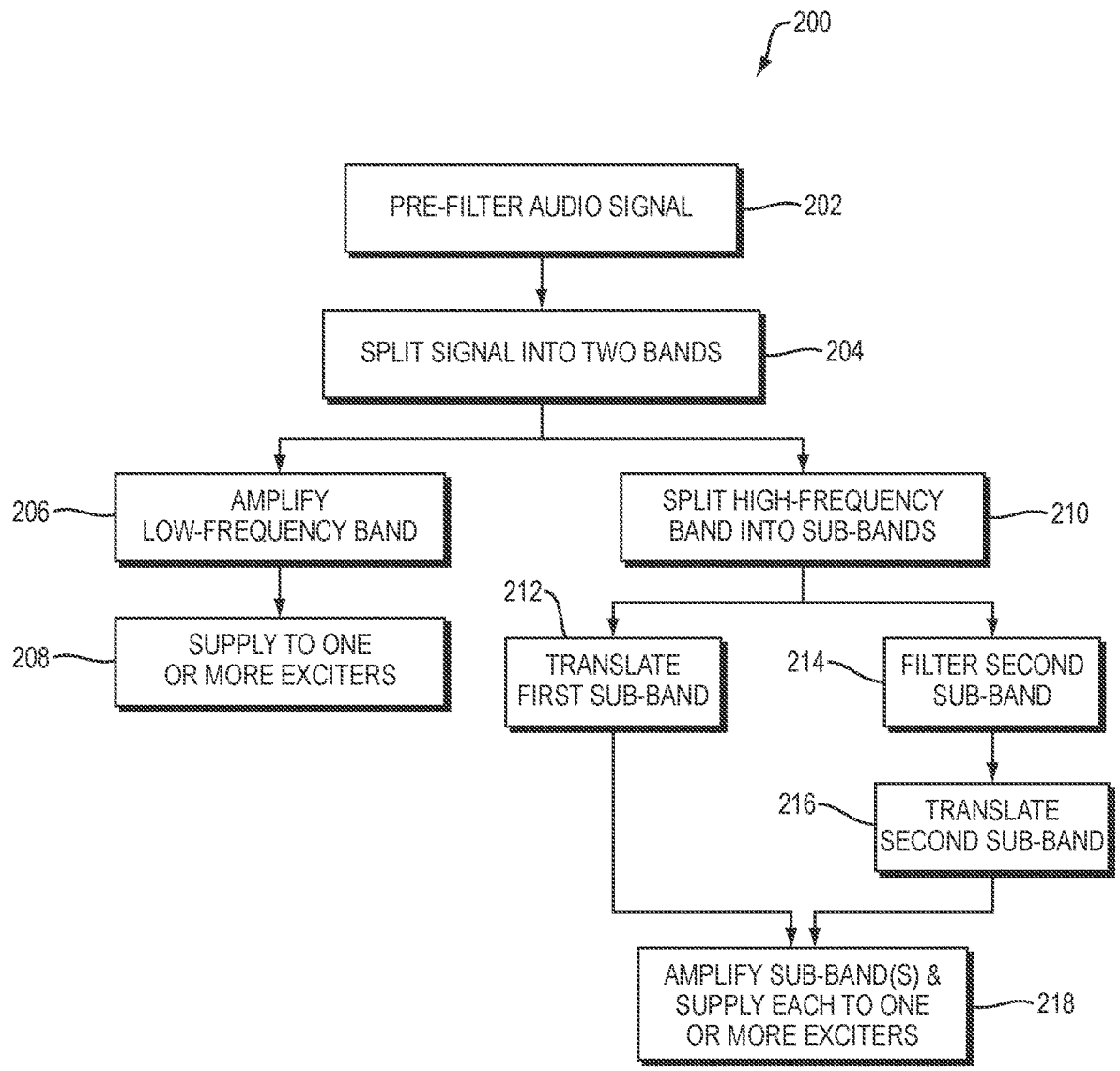
FIG. 2 is a flow chart of processing an audio signal so that it can be experienced haptically, according to one embodiment.

In general, the processor 104 (FIGS. 1A and 1B) performs the tasks of filtering and shifting frequency bands to generate at least two output signals. As described above, the different filtering and shifting operations may be performed using software and/or using hardware components such as filters, frequency shifters, modulators, etc. With reference to FIG. 2, in the process 200, an input audio signal is pre-filtered in step 202 using a low-pass filter to remove certain high-frequency components of the audio signal that are above a specified threshold. The threshold can be 4 kHz or 5 kHz. In some cases, the threshold can be adjusted by a user. The removed high-frequency components may include overtones of certain low-frequency components and, as such, at least a portion of the musical information contained in the overtone(s) is also represented by the corresponding low-frequency components that are retained. In some embodiments, the pre-filtering step 202 is optional.

The pre-filtered signal (or the original audio signal, if pre-filtering is not used), is split, i.e., filtered and separated into an original low-frequency band and an original high-frequency band, in step 204. A low-pass filter or a band-pass filter may be used to generate the two bands. In general, the frequency separating the two bands is approximately the same as (e.g., within 20%, 10%, 5%, 1%, etc.) the perception cut-off frequency. In some embodiments, the frequency separating the two bands is pre-set (e.g., at 1 kHz). In some cases, this frequency can be adjusted by the user. In step 206, the original low-frequency band signal is amplified, where the amplifier gain can be pre-set or may be adjustable by the user. For the sake of convenience, the term "band" may be used to indicate a "band signal." In some embodiments, the amplification step is omitted. The original low-frequency band signal (with or without amplification) is supplied to one or more exciters, in step 208.

In step 210, using one or more low-pass, high-pass, and/or band-pass filters, the original high-frequency-band signal is split further into two subbands: a first original high-frequency subband and a second original high-frequency subband. In some embodiments, the frequency separating the two subbands is pre-set (e.g., at 1.8 kHz, 2 kHz, 2.5 kHz, etc.). In some cases, this frequency can be adjusted by the user. In some embodiments, the original high-frequency-band signal may be split into three or more subbands, using different band-separation frequencies.

In step 212, the first original high-frequency subband is translated into a first synthesized low-frequency band, such that the highest frequency in the first synthesized low-frequency band is approximately equal to (e.g., within 20%, 10%, 5%, 1%, etc.), but does not exceed, the perception cut-off frequency (e.g., 750 Hz, 1 kHz, 1.2 kHz, etc.). The translation may include amplitude modulation or other techniques of frequency shifting.

In the optional step 214, the second original high-frequency subband is filtered further, to remove certain high frequencies therein, such that the bandwidth of the filtered second original high-frequency subband is approximately equal to (e.g., within 20%, 10%, 5%, 1%, etc.) the perception cut-off frequency. The perception cut-off frequency used in step 214 can be pre-fixed (e.g., at 3 kHz, 4 kHz, etc.) or may be adjusted by the user. In step 216, the second original high-frequency subband (with or without filtering) is translated into a second synthesized low-frequency band, such that the highest frequency in the second synthesized low-frequency band is approximately equal to (e.g., within 20%, 10%, 5%, 1%, etc.), but does not exceed, the perception cut-off frequency (e.g., 750 Hz, 1 kHz, 1.2 kHz, etc.). If filtering in step 214 is not performed, the bandwidth of the second original high-frequency subband may be greater than the perception cut-off frequency and, as such, the translation may be a non-linear translation or may include bandwidth compression.

In step 218, the first synthesized low-frequency-band signal is optionally amplified and supplied to one or more exciters. The second synthesized low-frequency-band signal is also optionally amplified and supplied to one or more other exciters. These exciters can thus vibrate according to at least some musical information contained in the original high-frequency band and, thus, provide that information haptically to a user.

In some embodiments, the steps 210, 212 are omitted. In these embodiments, the original high-frequency-band signal is optionally filtered (as described in step 214), and the filtered or unfiltered original high-frequency-band signal is translated into a synthesized low-frequency band (as described in step 216). Thereafter, the synthesized low-frequency-band signal is optionally amplified and supplied to one or more exciters. Here again, these exciters can vibrate according to at least some musical information contained in the original high-frequency band and, thus, provide that information haptically to a user.

Figure 3:
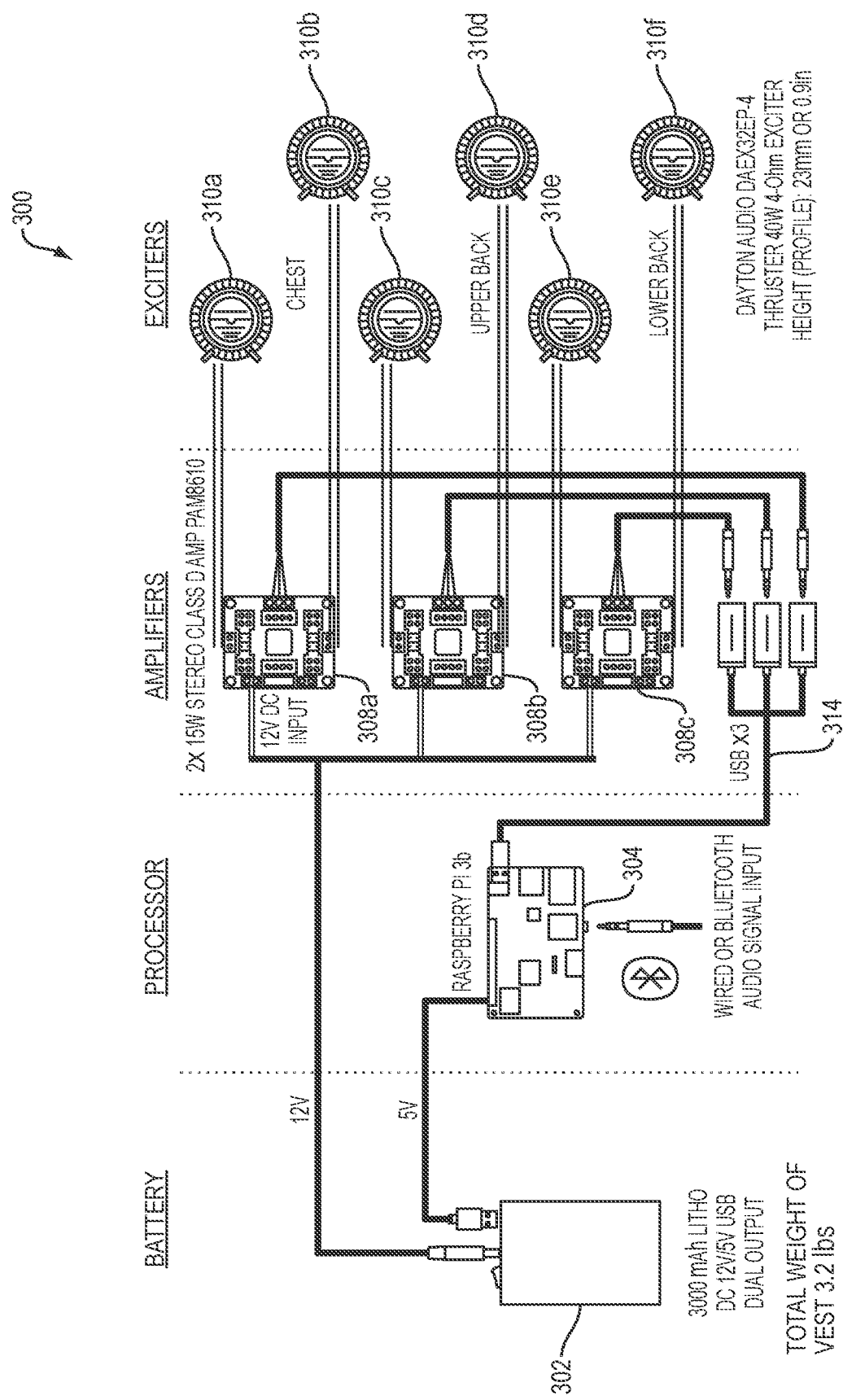
FIG. 3 illustrates components of a system for haptically experiencing music, according to one embodiment.

With reference to FIG. 3, various components of a system 300 (which is similar to the system 150 (FIG. 1B)), include a power supply 302. The power supply 302, e.g., a battery (which may be rechargeable), may supply power to the processor 304 and/or the amplifiers 308. Depending on the types of processor(s) and amplifier(s) used, the power supply may provide two or more output voltages (e.g., 1.2 V, 3 V, 5 V, 9 V, 12 V, etc.). The power may be supplied to the processor 304 and/or the amplifier(s) 308 using a USB connection.

The processor 304 supplies three outputs, namely, the original low-frequency-band signal, the first synthesized low-frequency-band signal, and the second synthesized low-frequency-band signal. These outputs are provided to the amplifiers 308 via three separate channels. In the system 300, these channels are provided using three USB cables 314. Other types of cables may be used in different embodiments and, in some cases, these signals may be supplied to the respective amplifiers using wireless connections.

Amplifier 308*a* is coupled to two exciters 310*a*, 310*b*; amplifier 308*b* is coupled to two different exciters 310*c*, 310*d*; and amplifier 308*c* is coupled to two different exciters 310*e*, 310*f*. Typically, each exciter pair (e.g., 310*a*, 310*b*) is placed on, i.e., in contact with or proximate to, a respective region of the torso. For example, the pair 310*a*, 310*b* may be placed on the front upper part of the torso; the pair 310*c*, 310*d* may be placed on the back upper part of the torso; and the pair 310*e*, 310*f* may be placed on the back lower part of the torso. The two exciters in a particular pair may be placed on the right and left portions of the selected region of the torso.

In some embodiments, the original low-frequency band is transmitted (with or without amplification) to the exciter(s) located at the upper front region of the torso; the first synthesized low-frequency band is transmitted (with or without amplification) to the exciter(s) located at the upper back region of the torso; and the second synthesized low-frequency band is transmitted (with or without amplification) to the exciter(s) located at the lower front region of the torso. This allows different parts of the torso to experience vibrations corresponding to those parts of the music that they may be better suited to experience. In other embodiments, the exciters may be located at other regions of the torso.

In some embodiments, the received input audio signal (e.g., signal 102 (FIGS. 1A and 1B)) is a stereo signal, having left and right components. In this case, the processor 304 may process each component separately, providing six different output signals. These signals may be supplied to six amplifiers, respectively, and the six amplified signals may be supplied to the six exciters 310. In some embodiments, the amplifier 308 is a two channel, 15 W stereo Class D amplifier. In some embodiments, the exciters are low-profile exciters, i.e., having a thickness of less than 1 inch, or less than 0.5 inch, or even thinner. An example of such an exciter is Dayton Audio DAEX32EP-4 Thruster, which is a 40 W, 4-ohm exciter. Other types of amplifiers and exciters are also contemplated in different embodiments. In general, all of the components of the system 300 are selected such that a vest carrying the system 300 is not too bulky or heavy, i.e., may weigh less than 4 lbs, 3 lbs, 2 lbs, etc.

Figure 4A:
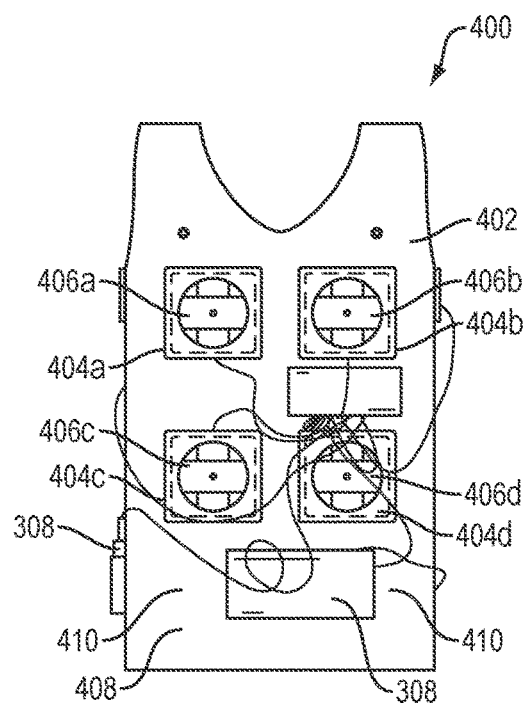
FIGS. 4A and 4B depict a vest that can used to house components of a system for haptically experiencing music, according to one embodiment.
Figure 4B:
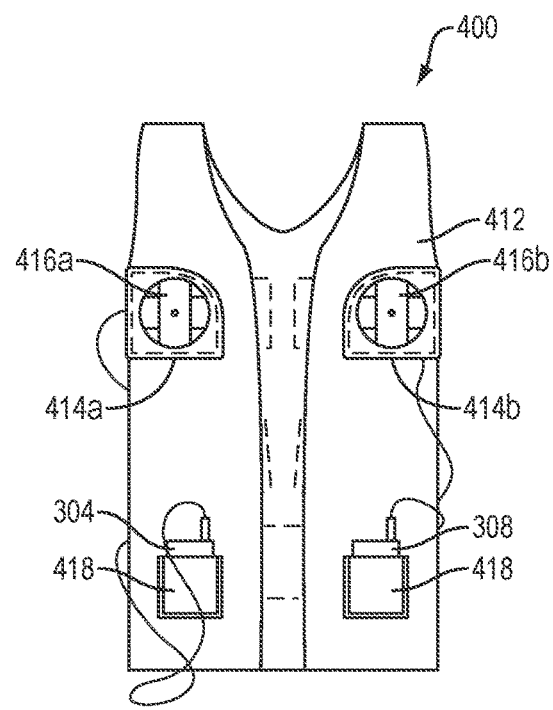

With reference to FIGS. 4A and 4B, the different components of the system 300 (FIG. 3) may be affixed to a vest 400 such that the vest can be worn comfortably even while performing activities such as dancing. As depicted in FIG. 4A, the back region 402 of the vest 400 includes pockets 404*a*-404*d*, each of which may hold a respective exciter 406*a*-406*d*. The back region 402 or the side 408 of the vest 400 may include additional pockets 410 that can hold other components of the system 300, such as the processor 304 and/or the amplifier(s) 308 (FIG. 3) coupled to the exciters 406*a*-406*d*. As shown in FIG. 4B, the front region 412 of the vest 400 includes pockets 414*a*, 414*b*, each of which may hold one exciter 416*a*, 416*b*. The front region 412 may include additional pockets 418 that can hold other components of the system 300, such as the processor 304 and/or the amplifier(s) 308 (FIG. 3) coupled to the exciters 416*a*, 416*b*. One or more of the exciters 406*a*-406*d* and 416*a*, 416*b* may thus be placed in contact (through the thin fabric of the vest 400) with the torso of a person, or proximate to the torso, so the person can experience the vibrations from the exciters.

Figures 5A, 5B, 5C:
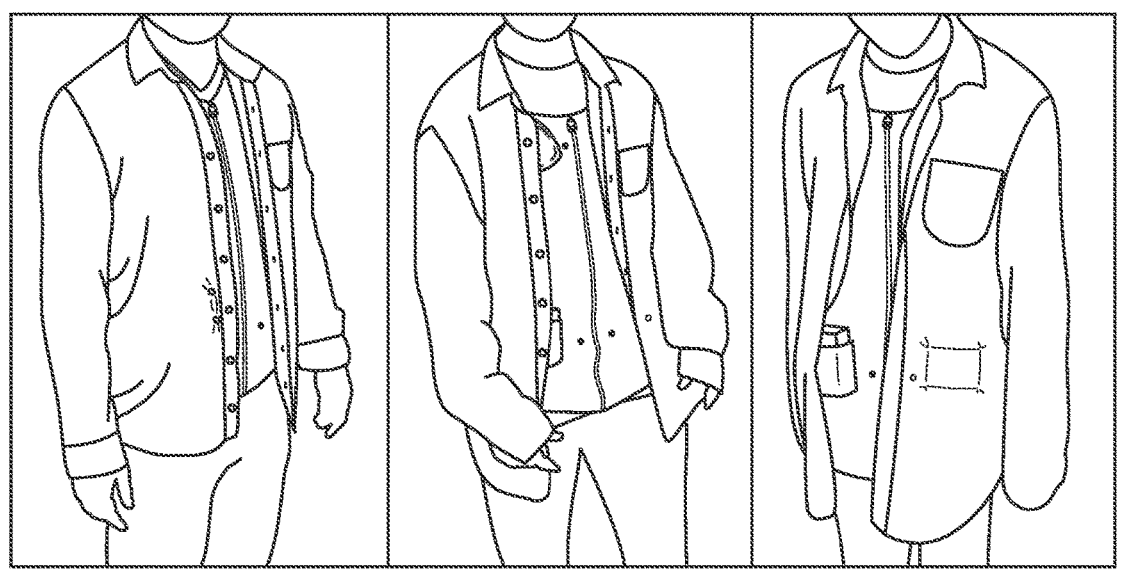
FIGS. 5A-5C depict the vest shown in FIGS. 4A and 4B, as worn by different persons.
Figure 6A:
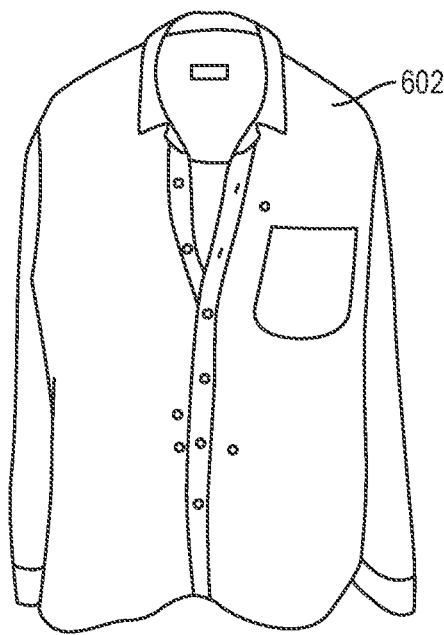
FIGS. 6A-6C illustrate concealing of a vest carrying components of a system for haptically experiencing music, according to one embodiment.
Figure 6B:
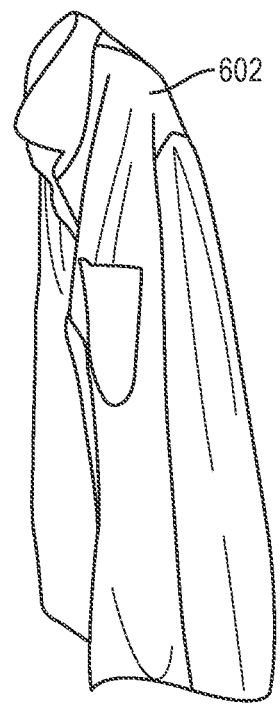
Figure 6C:
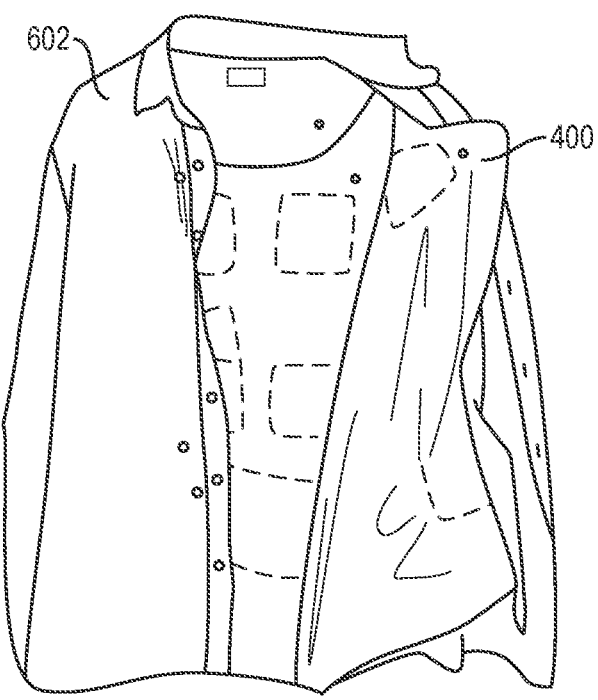

The use of thin-profile and lightweight components allows the vest 400 to be designed to fit persons of different physique, e.g., heights, as shown in FIGS. 5A-5C. Moreover, as can be seen in FIGS. 6A-6C, the vest 400 (FIGS. 4A and 4B), along with the components of the system 300 (FIG. 3) stored therein, can be concealed under a garment typically worn by a person, such as a shirt 602. FIGS. 6A and 6B show that the vest and the components do not cause the shirt to bulge excessively and the components can be accessed easily, as can be seen in FIG. 6C.

Figure 7A:
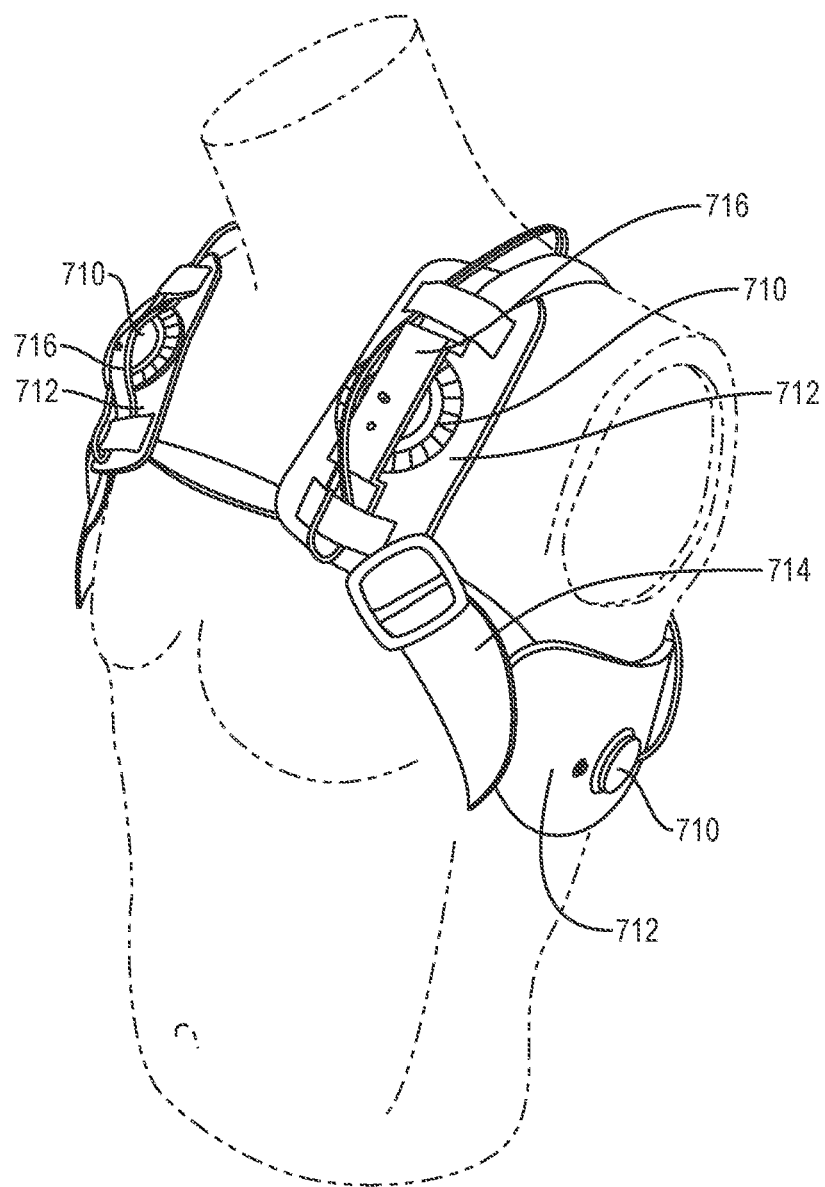
FIGS. 7A-7C depict a pad-harness assembly for carrying one or more components of a system for haptically experiencing music, according to one embodiment.

In some embodiments, the components of a system such as the system 300 (FIG. 3) need not be affixed to vest. Rather, with reference to FIGS. 7A-7C, one or more of these components, e.g., exciters 710 may be affixed to pads 712. The pads can be made with soft flexible foam, or of a material that attenuates the vibrations of a transducer placed thereon or amplifies such vibrations, or allows the vibrations to be distributed over an area of the skin that is larger than the surface area of the exciter 710. The pads 712 may be affixed to a harness 714, that may be worn on the torso 716. As such, different exciters may be placed in contact (through the pads 712) with the torso 716 or proximate to the torso, so the person wearing the harness 714 can experience the vibrations produced by the exciters.

Figure 7B:
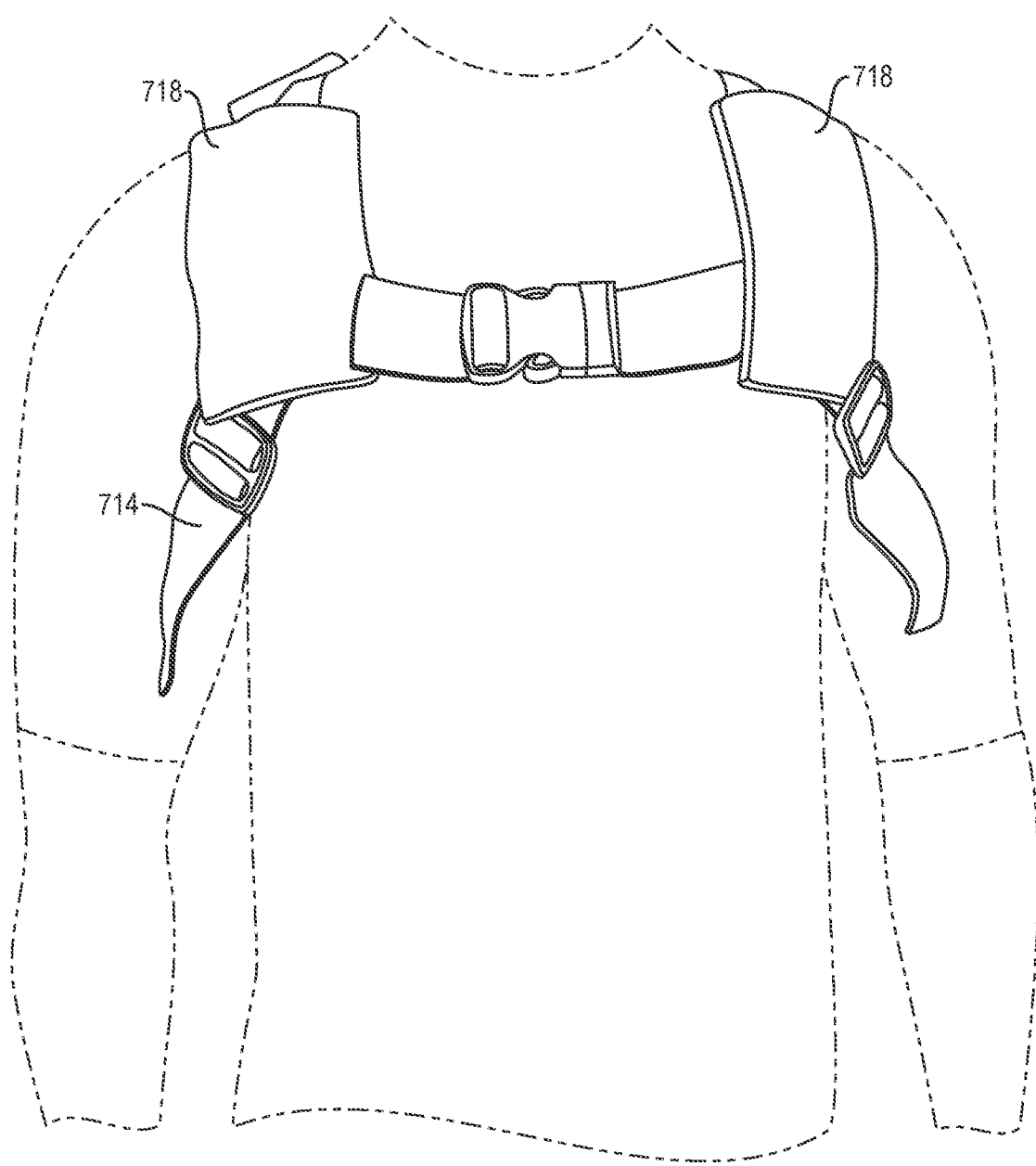
Figure 7C:
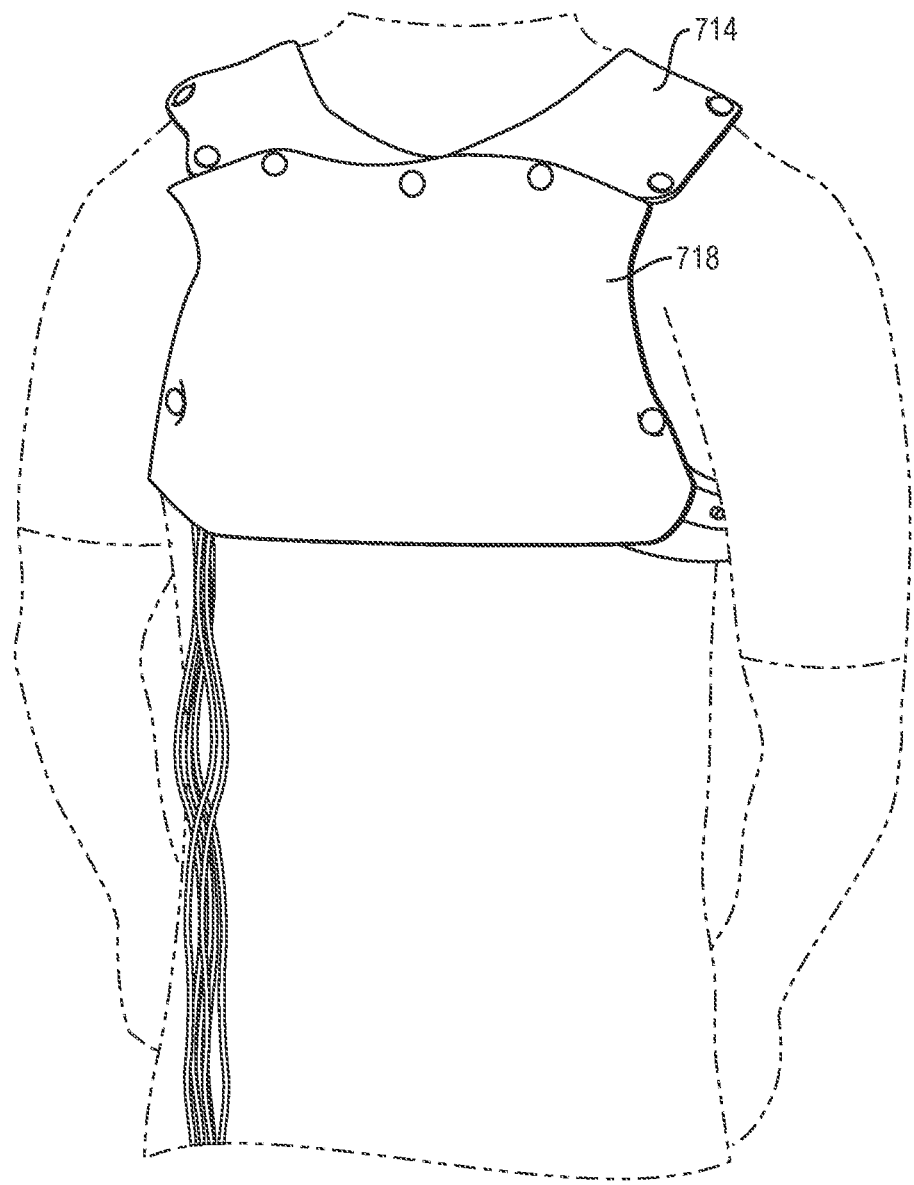

A pad 712 may also be made using plastic or another flexible material, and an adjustable fixture 716 (e.g., a screw) may be used to affix an exciter 710 to a pad 712. With the screw a user can adjust the contact force of the exciter 710, so as to balance user comfort and sensitivity to the vibrations produced by the exciter 710. The pads in the front, back, and/or side, along with the exciters 710 mounted thereon, may be concealed with a thin fabric 718, as can be seen in FIGS. 7B and 7C. Other components of the system, i.e., the processor and the optional amplifiers, may be enclosed in a package that can be carried by the person, e.g., in a pocket. In some embodiments, a pad having an exciter affixed thereto may be placed on (i.e., in contact with or proximate to) another part of the body, e.g., the ankle, arm, etc. Some embodiments use skin-safe adhesives and/or elastic bands as attachment mechanisms so that a person can carry one or more exciters and other system components, and where one or more exciters are placed on (i.e., in direct contact with) or near the person's skin. The attachments such as a pocket, a pad, an elastic band, etc., may be used with or without a vest or a harness. For example, an attachment may be used by itself to place an exciter on or near a person's skin, or may be used together with another garment such as a shirt, shorts, etc.

It is clear that there are many ways to configure the device and/or system components, interfaces, communication links, and methods described herein. The disclosed methods, devices, and systems can be deployed on convenient processor platforms, including network servers, personal and portable computers, and/or other processing platforms. Other platforms can be contemplated as processing capabilities improve, including personal digital assistants, computerized watches, cellular phones and/or other portable devices. The disclosed methods and systems can be integrated with known network management systems and methods. The disclosed methods and systems can operate as an SNMP agent, and can be configured with the IP address of a remote machine running a conformant management platform. Therefore, the scope of the disclosed methods and systems are not limited by the examples given herein, but can include the full scope of the claims and their legal equivalents.

The methods, devices, and systems described herein are not limited to a particular hardware or software configuration, and may find applicability in many computing or processing environments. The methods, devices, and systems can be implemented in hardware or software, or a combination of hardware and software. The methods, devices, and systems can be implemented in one or more computer programs, where a computer program can be understood to include one or more processor executable instructions. The computer program(s) can execute on one or more programmable processing elements or machines, and can be stored on one or more storage medium readable by the processor (including volatile and non-volatile memory and/or storage elements), one or more input devices, and/or one or more output devices. The processing elements/machines thus can access one or more input devices to obtain input data, and can access one or more output devices to communicate output data. The input and/or output devices can include one or more of the following: Random Access Memory (RAM), Redundant Array of Independent Disks (RAID), floppy drive, CD, DVD, magnetic disk, internal hard drive, external hard drive, memory stick, or other storage device capable of being accessed by a processing element as provided herein, where such aforementioned examples are not exhaustive, and are for illustration and not limitation.

The computer program(s) can be implemented using one or more high level procedural or object-oriented programming languages to communicate with a computer system; however, the program(s) can be implemented in assembly or machine language, if desired. The language can be compiled or interpreted. Sets and subsets, in general, include one or more members.

As provided herein, the processor(s) and/or processing elements can thus be embedded in one or more devices that can be operated independently or together in a networked environment, where the network can include, for example, a Local Area Network (LAN), wide area network (WAN), and/or can include an intranet and/or the Internet and/or another network. The network(s) can be wired or wireless or a combination thereof and can use one or more communication protocols to facilitate communication between the different processors/processing elements. The processors can be configured for distributed processing and can utilize, in some embodiments, a client-server model as needed. Accordingly, the methods, devices, and systems can utilize multiple processors and/or processor devices, and the processor/processing element instructions can be divided amongst such single or multiple processor/devices/processing elements.

The device(s) or computer systems that integrate with the processor(s)/processing element(s) can include, for example, a personal computer(s), workstation (e.g., Dell, HP), personal digital assistant (PDA), handheld device such as cellular telephone, laptop, handheld, or another device capable of being integrated with a processor(s) that can operate as provided herein. Accordingly, the devices provided herein are not exhaustive and are provided for illustration and not limitation.

References to "a processor", or "a processing element," "the processor," and "the processing element" can be understood to include one or more microprocessors that can communicate in a stand-alone and/or a distributed environment(s), and can thus be configured to communicate via wired or wireless communication with other processors, where such one or more processor can be configured to operate on one or more processor/processing elements-controlled devices that can be similar or different devices. Use of such "microprocessor," "processor," or "processing element" terminology can thus also be understood to include a central processing unit, an arithmetic logic unit, an application-specific integrated circuit (IC), and/or a task engine, with such examples provided for illustration and not limitation.

Furthermore, references to memory, unless otherwise specified, can include one or more processor-readable and accessible memory elements and/or components that can be internal to the processor-controlled device, external to the processor-controlled device, and/or can be accessed via a wired or wireless network using a variety of communication protocols, and unless otherwise specified, can be arranged to include a combination of external and internal memory devices, where such memory can be contiguous and/or partitioned based on the application. For example, the memory can be a flash drive, a computer disc, CD/DVD, distributed memory, etc. References to structures include links, queues, graphs, trees, and such structures are provided for illustration and not limitation. References herein to instructions or executable instructions, in accordance with the above, can be understood to include programmable hardware.

Although the methods and systems have been described relative to specific embodiments thereof, they are not so limited. As such, many modifications and variations may become apparent in light of the above teachings. Many additional changes in the details, materials, and arrangement of parts, herein described and illustrated, can be made by those skilled in the art. Accordingly, it will be understood that the methods, devices, and systems provided herein are not to be limited to the embodiments disclosed herein, can include practices otherwise than specifically described, and are to be interpreted as broadly as allowed under the law.

What is claimed is:

1. A system for delivering audio signals, comprising:
a first filter splitting an input audio signal into an original low-frequency band and an original high-frequency band;
a first frequency shifter transforming at least a portion of the original high-frequency band into a first synthesized low-frequency band;
a first first-location exciter configured to receive the original low-frequency band and produce corresponding vibrations; and
a first second-location exciter configured to receive the first synthesized low-frequency band and produce corresponding vibrations.

2. The system of claim 1, wherein:
the original low-frequency band comprises audio frequencies less than an original low-frequency threshold;
the original high-frequency band comprises audio frequencies greater than the original low-frequency threshold; and
the first synthesized low-frequency band comprises audio frequencies less than a synthesized low-frequency threshold.

3. The system of claim 2, wherein the original low-frequency threshold or the synthesized low-frequency threshold are adjustable.

4. The system of claim 2, wherein:
the original low-frequency threshold is about 1 kHz; or
the synthesized low-frequency threshold is about 1 kHz.

5. The system of claim 1, further comprising:
a wearable vest, wherein:
the first first-location exciter is affixed to a front of the wearable vest; and
the first second-location exciter is affixed to a back of the wearable vest.

6. The system of claim 1, further comprising:
a second filter splitting the original high-frequency band into a first original high-frequency subband and a second original high-frequency subband, wherein the first frequency shifter transforms the first original high-frequency subband into the first synthesized low-frequency band;
a second frequency shifter transforming the second original high-frequency subband into a second synthesized low-frequency band; and
a first third-location exciter configured to receive the second synthesized low-frequency band and produce corresponding vibrations.

7. The system of claim 6, wherein:
the original low-frequency band comprises audio frequencies less than an original low-frequency threshold;
the first original high-frequency subband comprises audio frequencies greater than the original low-frequency threshold and less than a first original high-frequency threshold;
the second original high-frequency subband comprises audio frequencies greater than the first original high-frequency threshold;
the first synthesized low-frequency band comprises audio frequencies less than a first synthesized low-frequency threshold; and
the second synthesized low-frequency band comprises audio frequencies less than a second synthesized low-frequency threshold.

8. The system of claim 7, wherein one or more of the original low-frequency threshold, the first original high-frequency threshold, the first synthesized low-frequency threshold, or the second synthesized low-frequency threshold are adjustable.

9. The system of claim 7, wherein one or more of:
the original low-frequency threshold is about 1 kHz;
the first original high-frequency threshold is about 2 kHz;
the first synthesized low-frequency threshold is about 1 kHz; or
the second synthesized low-frequency threshold is about 1 kHz.

10. The system of claim 6, further comprising:
a wearable vest, wherein:
the first first-location exciter is affixed to a front of the wearable vest;
the first second-location exciter is affixed to an upper portion of a back of the wearable vest; and
the first third-location exciter is affixed to a lower portion of the back of the wearable vest.

11. The system of claim 10, further comprising:
a second first-location exciter configured to receive the original low-frequency band and produce corresponding vibrations, wherein the second first-location exciter is affixed to the front of the wearable vest;
a second second-location exciter configured to receive the first synthesized low-frequency band and produce corresponding vibrations, wherein the second second-location exciter is affixed to the upper portion of a back of the wearable vest; and
a second third-location exciter configured to receive the second synthesized low-frequency band and produce corresponding vibrations, wherein the second third-location exciter is affixed to the lower portion of a back of the wearable vest.

12. The system of claim 1, further comprising:
a first amplifier amplifying the original low-frequency band; or
a second amplifier amplifying the first synthesized low-frequency band.

13. The system of claim 1, further comprising:
a low-pass pre-filter, filtering out frequencies above an adjustable permitted-frequency threshold from the input audio signal.

14. The system of claim 1, wherein:
the first first-location exciter and the first second-location exciters are adjustably affixed to a wearable pad.

15. The system of claim 1, further comprising:
a second first-location exciter configured to receive the original low-frequency band and produce corresponding vibrations; and
a second second-location exciter configured to receive the first synthesized low-frequency band and produce corresponding vibrations.

16. The system of claim 1, further comprising:
a power supply;
a processor implementing the first filter or the first frequency shifter; and
a vest or a harness having:
a first exciter attachment at a first location for holding the first first-location exciter;
a second exciter attachment at a second location for holding the first second-location exciter; and
one or more component attachments for holding one or more of the power supply, the processor, or an amplifier.

17. The system of claim 16, wherein:
weight of the system is less than 3.5 lbs; or
a thickness of the first first-location exciter is less than 1 inch.

18. The system of claim 1, further comprising:
an attachment for placing the first first-location exciter in contact with or near a person's skin, wherein the attachment comprises one or more of:
a pocket, a pad, a vibration attenuating pad, a vibration amplifying pad, a pad having an area larger than an area of the first first-location exciter, a pad having an adjustment mechanism to adjust pressure of the first first-location exciter on the person's skin, an elastic band, or an adhesive.

19. The system of claim 1, wherein one or more of:
the input audio signal is supplied to the first filter via a first wireless link;
the first filter is electrically coupled to the first frequency shifter via a second wireless link;
the first filter is electrically coupled to the first first-location exciter via a third wireless link; or
the first frequency shifter is electrically coupled to the first second-location exciter via a fourth wireless link.

20. A method for operating exciters using an audio signal, the method comprising:
splitting, using a first filter, an input audio signal into an original low-frequency band and an original high-frequency band;
transforming, using a first frequency shifter, at least a portion of the original high-frequency band into a first synthesized low-frequency band;
supplying the original low-frequency band to a first first-location exciter for producing corresponding vibrations; and
supplying the first synthesized low-frequency band to a first second-location exciter for producing corresponding vibrations.

* * * * *